(12) United States Patent
Shinagawa et al.

(10) Patent No.: US 9,848,489 B2
(45) Date of Patent: Dec. 19, 2017

(54) MULTILAYER RESIN SUBSTRATE, AND METHOD OF MANUFACTURING MULTILAYER RESIN SUBSTRATE

(71) Applicant: Murata Manufacturing Co., Ltd., Nagaokakyo-shi, Kyoto-fu (JP)

(72) Inventors: Hirofumi Shinagawa, Nagaokakyo (JP); Shigeru Tago, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/879,296

(22) Filed: Oct. 9, 2015

(65) Prior Publication Data
US 2016/0037622 A1    Feb. 4, 2016

Related U.S. Application Data

(63) Continuation of application No. PCT/JP2014/064912, filed on Jun. 5, 2014.

(30) Foreign Application Priority Data

Jul. 11, 2013    (JP) .................................. 2013-145698

(51) Int. Cl.
*H05K 1/00* (2006.01)
*H05K 1/02* (2006.01)
(Continued)

(52) U.S. Cl.
CPC ............. *H05K 1/025* (2013.01); *H05K 1/024* (2013.01); *H05K 1/028* (2013.01); *H05K 1/0216* (2013.01);
(Continued)

(58) Field of Classification Search
CPC .. H05K 1/00; H05K 1/03; H05K 1/09; H05K 1/14; H05K 1/16; H05K 3/10; H05K 3/30;
(Continued)

(56) References Cited

U.S. PATENT DOCUMENTS 4,368,503 A * 1/1983 Kurosawa ............... H05K 3/429
174/263
5,659,951 A * 8/1997 Gall ....................... H05K 1/116
205/126
(Continued)

FOREIGN PATENT DOCUMENTS

JP    2003-133466 A    5/2003
JP    2003-249731 A    9/2003
(Continued)

OTHER PUBLICATIONS

Official Communication issued in corresponding Japanese Patent Application No. 2015-504447, dated Apr. 19, 2016.
(Continued)

*Primary Examiner* — Xiaoliang Chen
(74) *Attorney, Agent, or Firm* — Keating & Bennett, LLP

(57) ABSTRACT

A multilayer resin substrate includes resin substrates laminated together, an overlapping portion in which a signal line as a conductor pattern and another conductor pattern overlap each other in a laminating direction of the resin substrates, and a non-overlapping portion in which the signal line and the other conductor pattern do no overlap each other in the laminating direction. A thin portion is provided at a position in the non-overlapping portion near the overlapping portion. The thin portion is a portion of the multilayer resin substrate which has a thickness smaller than the thickness in the overlapping portion in the laminating direction of the resin substrates.

8 Claims, 12 Drawing Sheets

(51) Int. Cl.
*H05K 1/11* (2006.01)
*H05K 1/03* (2006.01)
*H05K 3/46* (2006.01)

(52) U.S. Cl.
CPC ......... *H05K 1/0298* (2013.01); *H05K 1/0313* (2013.01); *H05K 1/115* (2013.01); *H05K 3/4685* (2013.01); *H05K 1/0219* (2013.01); *H05K 1/0225* (2013.01); *H05K 1/0393* (2013.01); *H05K 3/4632* (2013.01); *H05K 3/4635* (2013.01); *H05K 2201/0129* (2013.01); *H05K 2201/0141* (2013.01); *H05K 2201/09036* (2013.01); *H05K 2203/063* (2013.01)

(58) Field of Classification Search
CPC ... H05K 3/42; H05K 3/46; H05K 7/06; H01L 21/02; H01L 21/44; H01L 23/48; H01L 23/52; H01L 23/145; H01L 23/485
USPC ....... 174/254, 250, 251, 255, 256, 260, 263; 361/689, 783, 792; 257/570, 728, 758, 257/759, 762, E23.007
See application file for complete search history.

(56) References Cited

U.S. PATENT DOCUMENTS

| | | | | |
|---|---|---|---|---|
| 2003/0094697 | A1* | 5/2003 | Higashida | H01L 23/5387 257/758 |
| 2004/0036169 | A1* | 2/2004 | Higuchi | H01L 23/13 257/728 |
| 2004/0155734 | A1* | 8/2004 | Kosemura | H01L 23/49838 333/246 |
| 2005/0224251 | A1* | 10/2005 | Memis | H01L 23/145 174/255 |
| 2005/0224767 | A1* | 10/2005 | Japp | H05K 1/0373 252/570 |
| 2005/0224985 | A1* | 10/2005 | Japp | H01L 23/145 257/762 |
| 2008/0078570 | A1* | 4/2008 | Japp | H01L 23/145 174/256 |
| 2008/0191353 | A1* | 8/2008 | Japp | H01L 23/145 257/759 |
| 2009/0133913 | A1* | 5/2009 | Kushta | H01L 23/49827 174/260 |
| 2012/0204420 | A1* | 8/2012 | Asano | G03F 7/2014 29/846 |
| 2012/0247813 | A1* | 10/2012 | Ueda | H01L 23/49816 174/251 |
| 2012/0307470 | A1* | 12/2012 | Arai | H05K 7/06 361/783 |

FOREIGN PATENT DOCUMENTS

| | | |
|---|---|---|
| JP | 2004-104037 A | 4/2004 |
| JP | 2007-207629 A | 8/2007 |
| JP | 2008-091919 A | 4/2008 |
| JP | 2009-76663 A | 4/2009 |
| JP | 2010-135726 A | 6/2010 |
| JP | 2010-219262 A | 9/2010 |
| WO | 2007/046271 A1 | 4/2007 |
| WO | 2009/038950 A2 | 3/2009 |

OTHER PUBLICATIONS

Official Communication issued in corresponding Japanese Patent Application No. 2015-504447, dated Nov. 17, 2015.
Official Communication issued in International Patent Application No. PCT/JP2014/064912, dated Jul. 15, 2014.

* cited by examiner

MULTILAYER RESIN SUBSTRATE, AND METHOD OF MANUFACTURING MULTILAYER RESIN SUBSTRATE

BACKGROUND OF THE INVENTION

1. Field of the Invention

The present invention relates to a multilayer resin substrate that is a laminate of a plurality of resin substrates provided with a conductor pattern, and a method of manufacturing the multilayer resin substrate.

2. Description of the Related Art

In related art, a multilayer resin substrate, which is a laminate of a plurality of resin substrates provided with a conductor pattern, is used for various kinds of electronic equipment. Such a multilayer resin substrate is used in many applications as a wiring member (wiring cable) for transmitting high frequency signals. When used as a wiring member for transmitting high frequency signals, a multilayer resin substrate is required to have high flexibility to allow easy wiring, and also needs to be matched to an appropriate impedance (for example, 50Ω) suited for the electronic component to be connected.

Japanese Unexamined Patent Application Publication No. 2007-207629 discloses that as an insulating layer, a porous sheet is provided between a shield tape applied with a silver paste, and a conductor in the laminating direction of a multilayer resin substrate, thus causing the insulating layer have a low dielectric constant while reducing its thickness.

However, with the configuration according to Japanese Unexamined Patent Application Publication No. 2007-207629, depending on the positional relationship between holes formed in the porous sheet and the conductor, the distance between the shield tape and the conductor may vary, causing deviation from a desired impedance (electrical characteristics) in some cases.

SUMMARY OF THE INVENTION

Preferred embodiments of the present invention provide a multilayer resin substrate which makes it possible to increase flexibility without degradation of the electrical characteristics of a signal line, and a method of manufacturing the multilayer resin substrate.

A multilayer resin substrate according to a preferred embodiment of the present invention includes a plurality of resin substrates that are laminated together. The multilayer resin substrate includes an overlapping portion in which a signal line as a conductor pattern and another conductor pattern overlap each other in the laminating direction of the resin substrates, and a non-overlapping portion in which the signal line and the other conductor pattern do not overlap each other in the laminating direction of the resin substrates. The other conductor pattern is, for example, a ground pattern, another signal line, or a capacitance pattern.

Further, a thin portion is provided at a position in the non-overlapping portion near the overlapping portion. The thin portion is a portion of the multilayer resin substrate which has a thickness smaller than a thickness in the overlapping portion in the laminating direction of the resin substrates. In plan view, the thin portion is located between, for example, a plurality of the signal lines.

Since the multilayer resin substrate is provided with the thin portion as described above, its flexibility is sufficiently increased, thus allowing easy wiring. Generally, a multilayer resin substrate tends to have low flexibility if the multilayer resin substrate includes an overlapping portion in which a signal line and another conductor pattern overlap each other in the laminating direction of resin substrates. Various preferred embodiments of the present invention prove particularly advantageous in this respect.

Further, the thin portion is located so as to avoid the overlapping portion in which the signal line and the other conductor pattern overlap each other in the laminating direction of the resin substrates. Therefore, degradation of characteristics due to factors such as variation of impedance and radiation noise is significantly reduced or prevented.

Further, in plan view, the thin portion may be formed by, for example, a plurality of recesses arranged between the signal lines in the direction in which the signal lines extend.

Further, for each of the resin substrates, a resin sheet having high flexibility or a resin sheet having thermal plasticity may be used.

A method of manufacturing a multilayer resin substrate according to another preferred embodiment of the present invention includes a first step of forming a signal line as a conductor pattern in at least one of a plurality of resin substrates, a second step of forming another conductor pattern different from the signal line formed by the first step, in at least one of the resin substrates, a third step of forming a hole or a recess in at least one of the resin substrates, at a position in a non-overlapping portion near an overlapping portion, the non-overlapping portion being a portion in which the signal line and the other conductor pattern do not overlap each other in a laminating direction when the resin substrates are laminated together, the overlapping portion being a portion in which the signal line and the other conductor pattern overlap each other in the laminating direction when the resin substrates are laminated together, and a fourth step of stacking the resin substrates, and joining the stacked resin substrates together.

As a result, a multilayer resin substrate with increased flexibility is manufactured, without degradation of the electrical characteristics of the signal line.

The order of the first step, the second step, and the third step may be changed. For example, if the second step is performed earlier than the first step, the third step may be performed earlier than the first step, or the third step may be performed after the first step.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, multilayer resin substrates according to preferred embodiments of the present invention will be described.

Figure 1:
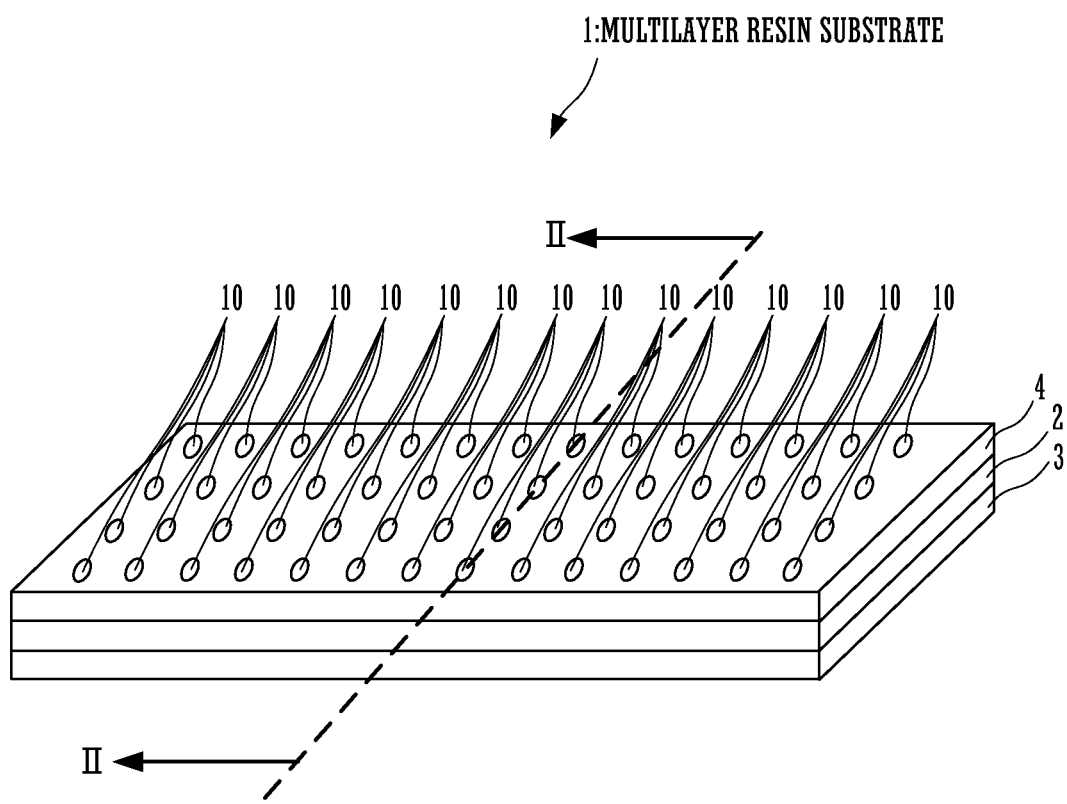
FIG. 1 schematically illustrates a multilayer resin substrate according to a preferred embodiment of the present invention.
Figure 2:
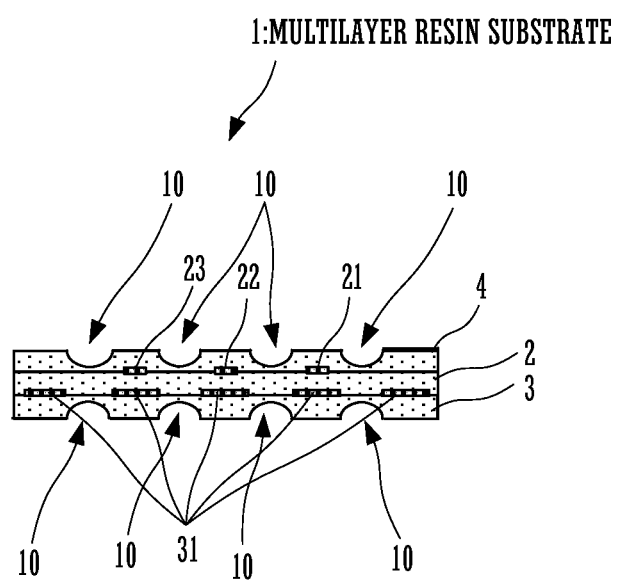
FIG. 2 is a sectional view of a multilayer resin substrate according to a preferred embodiment of the present invention.

FIG. 1 schematically illustrates a multilayer resin substrate according to a present preferred embodiment of the present invention. FIG. 2 is a sectional view taken along the direction II-II illustrated in FIG. 1.

Figure 3:
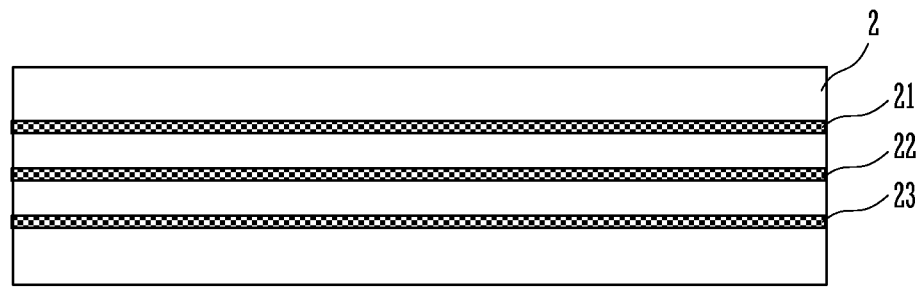
FIG. 3 is a plan view of a resin substrate in which a plurality of signal lines are formed as a conductor pattern according to a preferred embodiment of the present invention.
Figure 4:
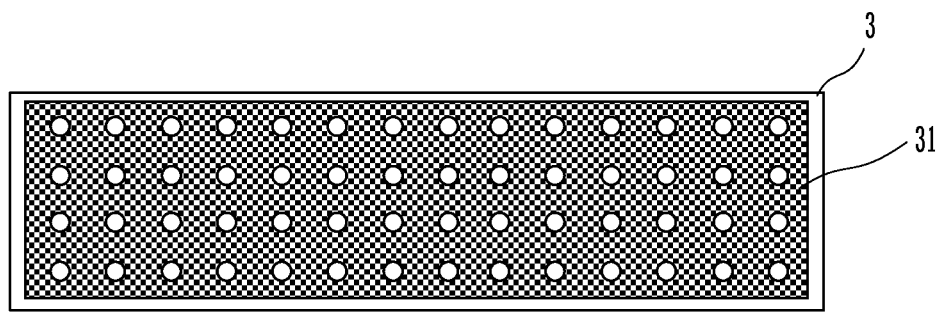
FIG. 4 is a plan view of a resin substrate in which a ground is formed as a conductor pattern according to a preferred embodiment of the present invention.

A multilayer resin substrate 1 according to this preferred embodiment preferably includes three resin substrates 2 to 4 that are laminated together, for example. In FIGS. 1 and 2, as illustrated in FIG. 3, the resin substrate 2 preferably includes a plurality (for example, preferably three in this preferred embodiment) of signal lines 21 to 23 provided on a resin sheet as a conductor pattern. The signal lines 21 to 23 extend in the longitudinal direction of the resin substrate 2, and are arranged in parallel or substantially in parallel to each other in the transverse direction of the resin substrate 2. As illustrated in FIG. 4, the resin substrate 3 includes a ground conductor 31 provided on a resin sheet as a conductor pattern. The resin substrate 4 is a resin sheet provided with no conductor pattern. The resin sheet defining each of the resin substrates 2 to 4 is made of a material that has high flexibility and thermal plasticity (for example, a liquid crystal polymer sheet). As described below, the resin substrates 2 and 3 are prepared preferably by sticking a metal film made of, for example, a copper foil, on one side of a resin sheet, or by using a single-sided copper clad sheet or the like.

The resin substrates 3 and 4 each include a plurality of recesses 10 on the side opposite to the side in contact with the resin substrate 2. The ground conductor 31 provided in the resin substrate 3 has such a shape that the metal film is removed in the areas corresponding to the recesses 10 (cavities are provided in the areas corresponding to the recesses 10). As illustrated in FIG. 1, in the resin substrates 3 and 4, a plurality of rows of the recesses 10 arranged in the direction in which the signal lines 21 to 23 extend (the longitudinal direction of the resin substrates 3 and 4) extend in the transverse direction of the resin substrates 3 and 4. That is, the recesses 10 are disposed along the direction in which the signal lines 21 to 23 extend. The recesses 10 provided in the resin substrate 3, and the recesses 10 provided in the resin substrate 4 are substantially opposed to each other with the resin substrate 2 interposed therebetween. Further, the recesses 10 are located near the signal lines 21 to 23 provided in the resin substrate 2. More specifically, the recesses 10 are located at a position in a non-overlapping portion, in which the signal lines 21 to 23 and the ground conductor 31 do not overlap each other in the laminating direction of the resin substrates 2 to 4, near an overlapping portion in which the signal lines 21 to 23 and the ground conductor 31 overlap each other in the laminating direction. That is, the recesses 10 are located so as to avoid the overlapping portion in which the signal lines 21 to 23 and the ground conductor 31 overlap each other in the laminating direction of the resin substrates 2 to 4. Further, in plan view, the recesses 10 are provided between the signal lines 21 to 23 provided in the resin substrate 2, between the signal line 21 and an end portion of the resin substrate 3 which is located on the signal line 21 side in the transverse direction, and between the signal line 23 and an end portion of the resin substrate 3 which is located on the signal line 23 side in the transverse direction.

In plan view, the recesses 10 are located so as not to overlap the signal lines 21 to 23 provided in the resin substrate 2.

The thickness of the multilayer resin substrate 1 in the laminating direction of the resin substrates 2 to 4 is smaller in the portion that is provided with the recesses 10, than in the portion that is not provided with the recesses 10. The recesses 10 define a thin portion.

The multilayer resin substrate 1 according to this preferred embodiment is provided with the recesses 10 to partially reduce the thickness in the laminating direction of the resin substrates 2 to 4. Therefore, the flexibility of the multilayer resin substrate 1 is increased, thus allowing easy wiring.

Further, the recesses 10 are located so as to avoid the overlapping portion in which the signal lines 21 to 23 provided in the resin substrate 2 and the ground conductor 31 provided in the resin substrate 3 overlap each other in the laminating direction of the resin substrates 2 to 4. This makes it possible to significantly reduce or prevent degradation of characteristics due to factors such as variation of impedance and radiation noise. Further, the recesses 10 create an air space with low dielectric constant between the transmission paths defined by the signal lines 21 to 23 that are adjacent to each other. Therefore, isolation between the signal lines 21 to 23 is also improved.

Next, a non-limiting example of a manufacturing process for the multilayer resin substrate 1 according to this preferred embodiment will be described. In this example, the manufacturing process for the multilayer resin substrate 1 includes the following four steps of preparing the resin substrate 2, preparing the resin substrate 3, preparing the resin substrate 4, and bonding a stack of the resin substrates 2 to 4 together.

Step of Preparing Resin Substrate 2

FIGS. 5A to 5D illustrate this step. First, a copper foil 2b is stuck on one side of a resin sheet 2a (see FIG. 5A), or a single-sided copper clad sheet is prepared.

Figure 5A:
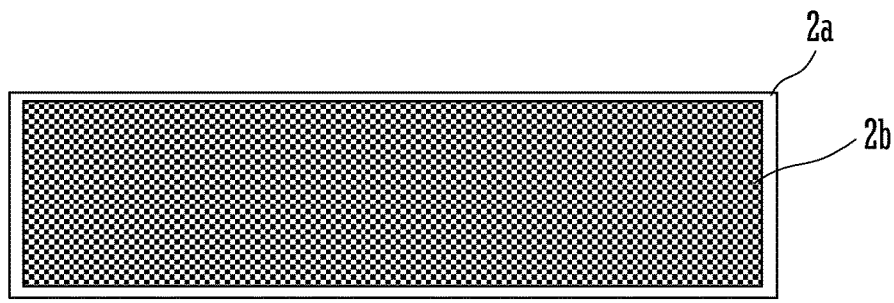
FIGS. 5A to 5D illustrate a manufacturing process for a multilayer resin substrate according to a preferred embodiment of the present invention.
Figure 5B:
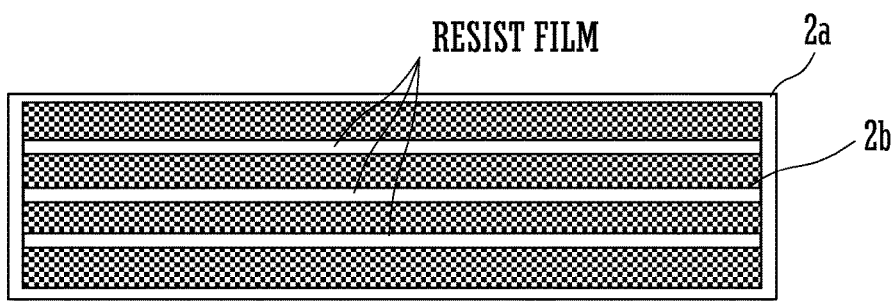
Figure 5C:
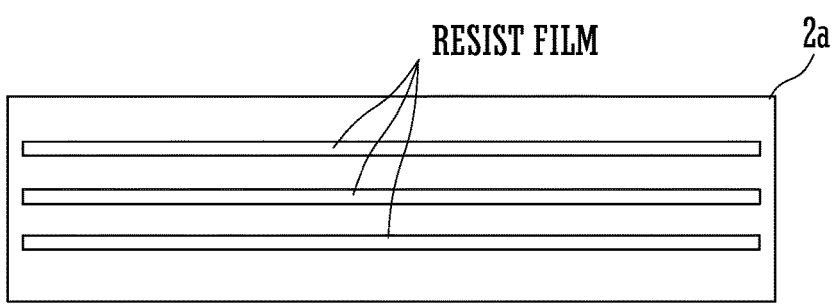
Figure 5D:
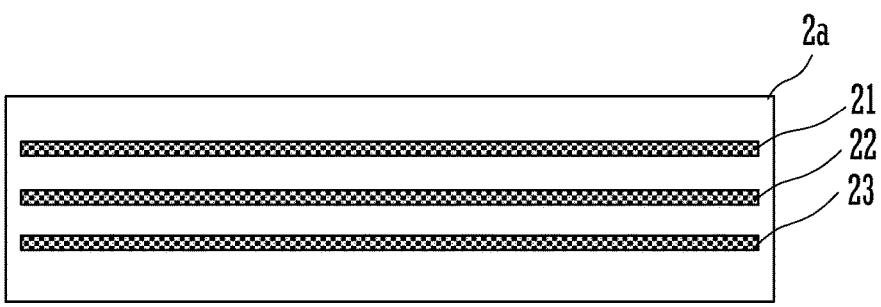

A resist film is patterned on the copper foil 2b in accordance with the pattern of the signal lines 21 to 23 to be formed (see FIG. 5B). Etching is performed to form the signal lines 21 to 23 (see FIG. 5C), and the resist film is removed (see FIG. 5D). This completes preparation of the resin substrate 2.

Step of Preparing Resin Substrate 3

FIGS. 6A to 6E illustrate this step. First, a copper foil 3b is stuck on one side of a resin sheet 3a (see FIG. 6A), or a single-sided copper clad sheet is prepared. A resist film is patterned on the copper foil 3b in accordance with the pattern of the ground conductor 31 (the pattern of the recesses 10) to be formed (see FIG. 6B). Etching is performed to form the ground conductor 31 (see FIG. 6C), and the resist film is removed (see FIG. 6D). Then, holes are bored in the areas where the recesses 10 are to be formed (the areas where the copper foil 3b has been removed by the above etching), by irradiating the areas with laser light from the other side of the resin sheet 3a (the side on which the copper foil 3b is not stuck) (see FIG. 6E). This completes preparation of the resin substrate 3.

Figure 6A:
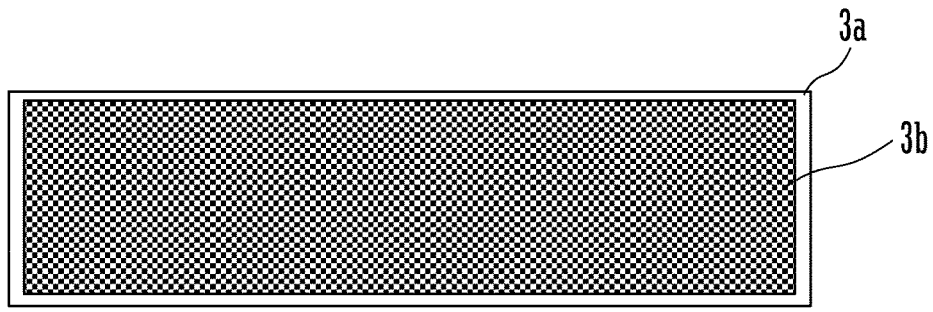
FIGS. 6A to 6E illustrate a manufacturing process for a multilayer resin substrate according to a preferred embodiment of the present invention.
Figure 6B:
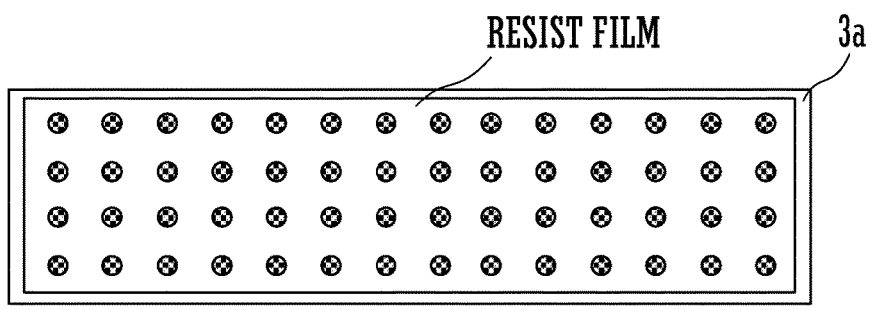
Figure 6C:
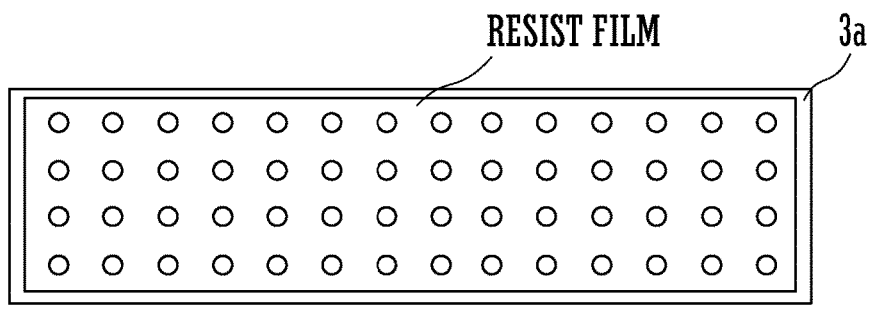
Figure 6D:
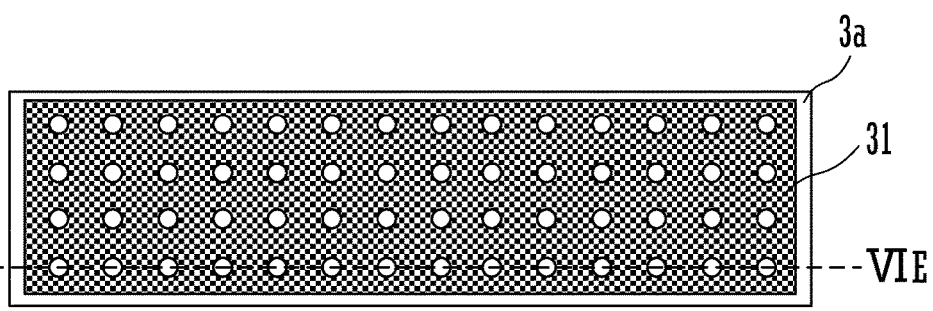
Figure 6E:
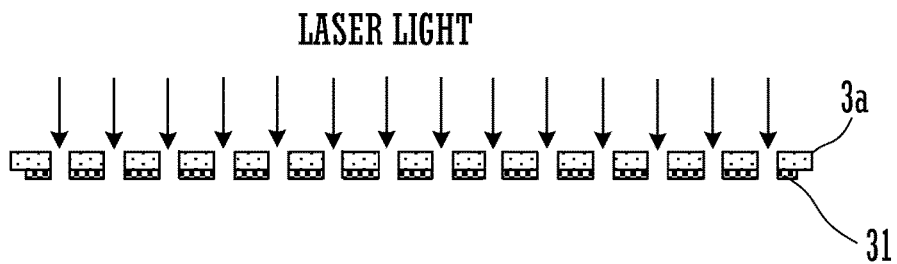

FIG. 6E is a sectional view taken along a line VIE-VIE illustrated in FIG. 6D.

Step of Preparing Resin Substrate 4

Holes are bored in the areas where the recesses 10 are to be formed, by irradiating the areas with laser light from one side of the resin sheet. The pattern of boring for this resin sheet, and the pattern of boring for the resin sheet 3a mentioned above are the same. This completes preparation of the resin substrate 4.

Step of Bonding Stacked Resin Substrates 2 to 4 Together

Figure 7A:
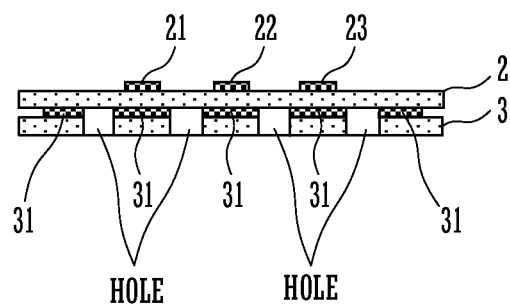
FIGS. 7A and 7B illustrate a manufacturing process for a multilayer resin substrate according to a preferred embodiment of the present invention.

The resin substrate 2 is laid over the side of the resin substrate 3 which is provided with the ground conductor 31 (see FIG. 7A). The resin substrate 2 is laid over in such a way that the side of the resin substrate 2 which is not provided with the signal lines 21 to 23 comes into contact with the resin substrate 3. Further, alignment is performed so that the signal lines 21 to 23 and the holes formed in the resin substrate 3 are not opposed to each other. Further, the holes formed in the resin substrate 3 are disposed at a position where the signal lines 21 to 23 and the ground conductor 31 do not overlap each other in the laminating direction, and which is near a position where the signal lines 21 to 23 and the ground conductor 31 overlap each other in the laminating direction.

Figure 7B:
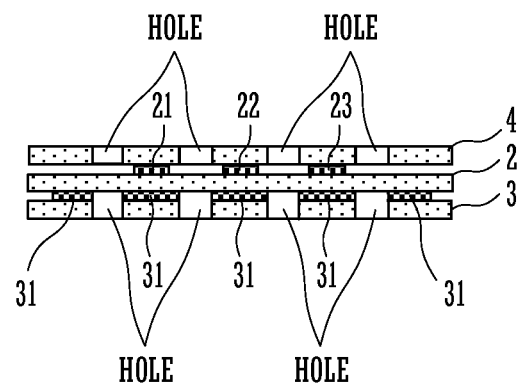

The resin substrate 4 is laid over the side of the resin substrate 2 which is provided with the signal lines 21 to (see FIG. 7B). Further, alignment is performed so that the signal lines 21 to 23 and the holes formed in the resin substrate 4 are not opposed to each other. More specifically, the holes formed in the resin substrate 3, and the holes formed in the resin substrate 4 are disposed at positions corresponding to each other (at overlapping positions in the laminating direction). That is, like the holes formed in the resin substrate 3, the holes formed in the resin substrate 4 are disposed at a position where the signal lines 21 to 23 and the ground conductor 31 do not overlap each other in the laminating direction, and which is near a position where the signal lines 21 to 23 and the ground conductor 31 overlap each other in the laminating direction. The holes formed in the resin substrate 3 and the holes formed in the resin substrate 4 may not be disposed at positions corresponding to each other, as long as these holes are disposed at positions where the signal lines 21 to 23 and the ground conductor 31 do not overlap in the laminating direction.

Heat and pressure are applied to the stack of the resin substrates 2 to 4 to bond these substrates together. Since the resin sheet is thermoplastic as described above, fluidization occurs during this process. As a result, the holes formed in the resin substrate 3 and the holes formed in the resin substrate 4 are closed, creating the recesses 10 illustrated in FIGS. 1 and 2. Because the resin sheet 2a is thermoplastic, use of adhesive is unnecessary.

In this way, the multilayer resin substrate 1 can be manufactured through a simple process.

In the above preferred embodiment, the recesses 10 preferably are located so as to avoid the signal lines 21 to 23 formed in the resin substrate 2 as a conductor pattern, for example. However, the recesses 10 may be located at a position corresponding to the signal lines 21 to 23, as long as the recesses 10 are located in a non-overlapping portion in which the signal lines 21 to 23 and the ground conductor 31 do not overlap each other in the laminating direction.

The multilayer resin substrate 1 may be formed not by application of pressure but by joining the stacked resin substrates 2 to 4 together by use of an adhesive layer, for example. The use of an adhesive layer makes it possible to significantly reduce or prevent variation of the distance between the signal lines 21 to 23 and the ground conductor 31.

In the above preferred embodiment, holes similar to those in the resin substrates 3 and 4 preferably are not formed in the resin sheet 2a of the resin substrate 2. However, holes similar to those in the resin substrates 3 and 4 may be formed also in the resin sheet 2a (the process associated with boring mentioned above may be performed). This further increases the depth of the recesses 10 formed in the multilayer resin substrate 1 in its final manufactured state, causing the thickness of the multilayer resin substrate 1 to become smaller (thinner), thus further improving the flexibility of the multilayer resin substrate 1.

In the case of forming holes in each of the resin substrates 2 to 4, even if the holes are left as through holes without being closed by fluidized resin, this presents no particular problem.

The Step of Preparing Resin Substrate 2, Step of Preparing Resin Substrate 3, and Step of Preparing Resin Substrate 4 described above may be performed in any order. Further, the Step of Preparing Resin Substrate 3 may be divided into the step of forming the ground conductor 31 on the resin sheet 3a, and the step of boring holes in the resin sheet 3a on which the ground conductor 31 has been formed, and the Step of Preparing Resin Substrate 2 or Step of Preparing Resin Substrate 4 mentioned above may be performed between these steps.

Figure 8A:
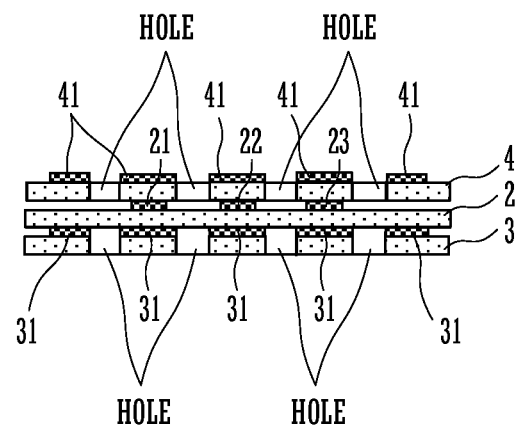
FIGS. 8A and 8B schematically illustrate a multilayer resin substrate according to another preferred embodiment of the present invention.
Figure 8B:
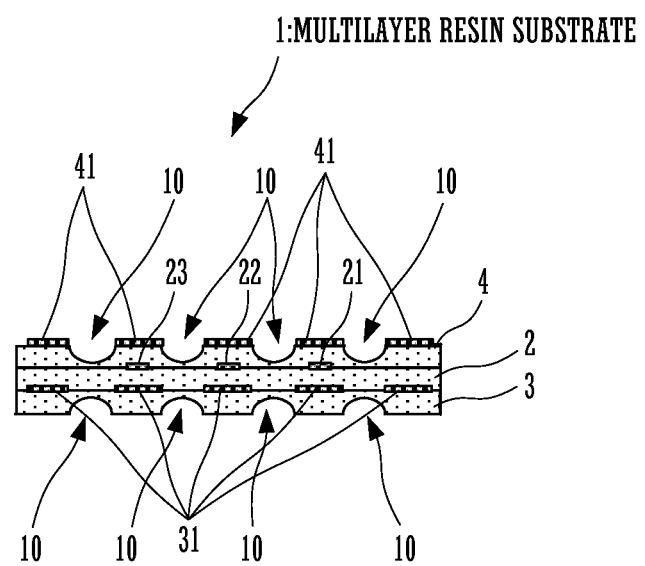

In the above preferred embodiment, the resin substrate 4 preferably is not provided with a conductor pattern. However, the resin substrate 4 may be provided with a ground conductor 41 having the same pattern as that in the resin substrate 3 according to the above preferred embodiment (the resin substrate and the resin substrate 4 may have the same configuration). In this case, the multilayer resin substrate 1 illustrated in FIG. 8B can be manufactured by performing the application of heat and pressure mentioned above after stacking the resin substrates 2 to 4 as illustrated in FIG. 8A. In this case as well, the holes formed in the resin substrate 3 and the holes formed in the resin substrate 4 are preferably disposed at positions corresponding to each other (at overlapping positions in the laminating direction). Further, the holes formed in the resin substrate 3 and the holes formed in the resin substrate 4 are each disposed at a position where the signal lines 21 to 23 and the ground conductor 31 or 41 do not overlap each other in the laminating direction, and which is near a position where the signal lines 21 to 23 and the ground conductor 31 or 41 overlap each other in the laminating direction.

In the multilayer resin substrate 1 mentioned above, the signal lines 21 to 23 formed in the resin substrate 2 are preferably located between the ground conductors 31 and 41. This makes it possible to further reduce or prevent degradation of characteristics due to factors such as variation of impedance and radiation noise caused by an external influence such as an approaching metal object.

In this preferred embodiment as well, the recesses 10 are preferably located so as to avoid the signal lines 21 to 23 formed in the resin substrate 2 as a conductor pattern. However, the recesses 10 may be located at a position corresponding to the signal lines 21 to 23, as long as the recesses 10 are located in a non-overlapping portion in which the signal lines 21 to 23 and the ground conductor 31 or 41 do not overlap each other in the laminating direction.

Figure 9:
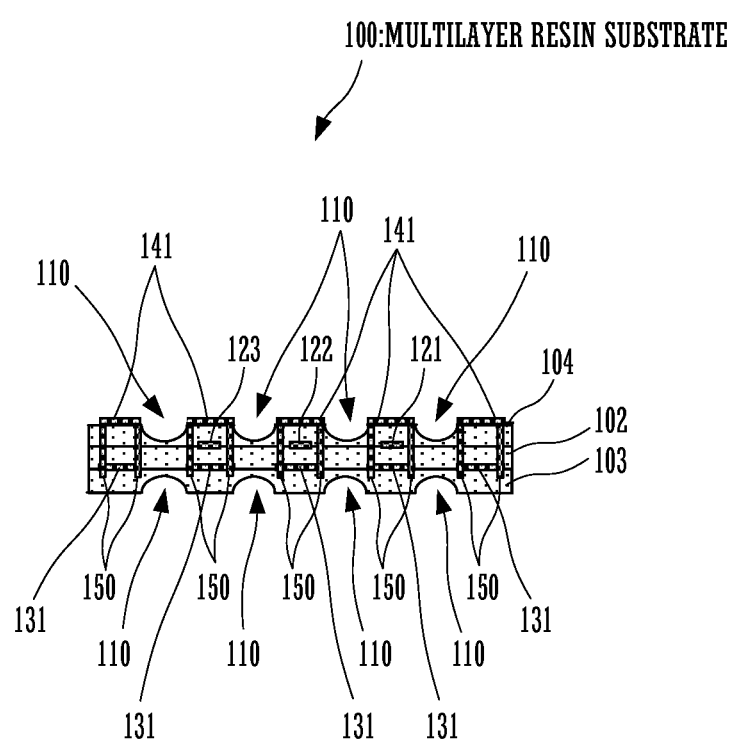
FIG. 9 schematically illustrates a multilayer resin substrate according to another preferred embodiment of the present invention.

Further, as in a multilayer resin substrate 100 illustrated in FIG. 9, a via conductor 150 may be provided to connect a ground conductor 131 formed in a resin substrate 103 and a ground conductor 141 formed in a resin substrate 104. In this case, the via conductor 150 is preferably formed in a resin substrate 102 from which the resist film has been removed in the manner as described above with reference to FIG. 5D (the resin substrate 2 in the state illustrated in FIG. 5D). Further, the via conductor 150 is preferably formed in each of the resin substrates 103 and 104 for which the boring process described above with reference to FIG. 6E has been completed (the resin substrate 3 in the state illustrated in FIG. 6E). Prior to heating, the via conductors 150 individually formed in the resin substrates 102 to 104 are preferably in the form of a through hole filled with a conductive paste. The via conductors 150 in this state are solidified and electrically connected to each other during the process of applying heat and pressure performed after stacking the resin substrates 102 to 104.

As in the above preferred embodiment, in the multilayer resin substrate 100, recesses 110 are located so as to avoid an overlapping portion in which signal lines 121 to 123 and the ground conductor 131 or 141 overlap each other in the laminating direction. More specifically, the recesses 110 are located at a position in a non-overlapping portion, in which the signal lines 121 to 123 and the ground conductor 131 or 141 do not overlap each other in the laminating direction, near the above-mentioned overlapping portion. Further, the recesses 110 are located so as to avoid the signal lines 121 to 123 formed in the resin substrate 102 as a conductor pattern.

Providing the via conductor 150 in this way makes it possible to significantly reduce or prevent variation of the distance between the ground conductor 131 formed in the resin substrate 103 and the ground conductor 141 formed in the resin substrate 104, which occurs during the above-mentioned process of applying heat and pressure to the stack of the resin substrates 102 to 104. This makes it possible to further significantly reduce or prevent degradation of characteristics due to, for example, variation of impedance in the multilayer resin substrate 100 in its final manufactured state. Furthermore, the ground conductors 131 and 141 are connected by use of the via conductor 150, thus increasing the overall strength of the ground.

In this preferred embodiment as well, the recesses 110 are preferably located so as to avoid the signal lines 121 to 123 formed in the resin substrate 102 as a conductor pattern. However, the recesses 110 may be located at a position corresponding to the signal lines 121 to 123, as long as the recesses 110 are located in a non-overlapping portion in which the signal lines 121 to 123 and the ground conductor 131 or 141 do not overlap each other in the laminating direction.

Figure 10:
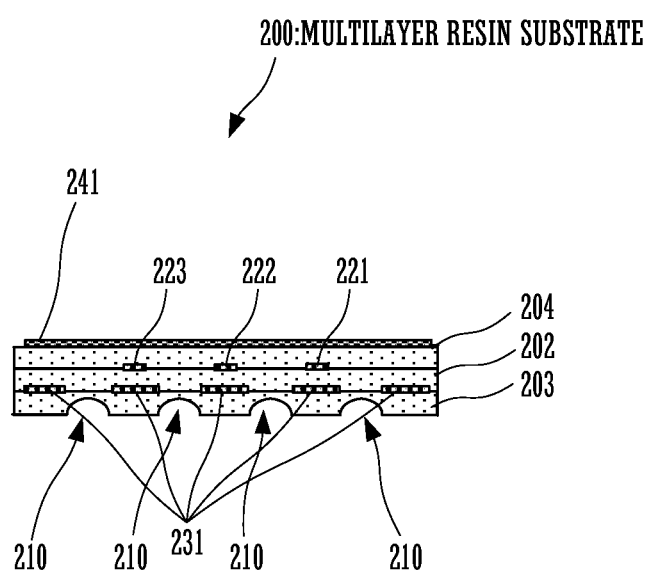
FIG. 10 schematically illustrates a multilayer resin substrate according to another preferred embodiment of the present invention.

If, as in a multilayer resin substrate 200 illustrated in FIG. 10, ground conductors 231 and 241 are to be formed in resin substrates 203 and 204 as a conductor pattern, respectively, one of the resin substrates 203 and 204 (the resin substrate 203 in this case) may be the resin substrate prepared by the step illustrated in FIGS. 6A to 6E, and the other resin substrate (the resin substrate 204 in this example) may be the single-sided copper clad sheet illustrated in FIG. 5A or 6A. That is, the above-mentioned process of boring holes may not be performed for the resin substrate 204.

In the multilayer resin substrate 200 configured in this way, as illustrated in FIG. 10, the resin substrate 203 is preferably provided with recesses 210, and the other resin substrate 204 is not provided with the recesses 210. As in the above-mentioned preferred embodiment, the recesses 210 in the resin substrate 203 are located so as to avoid an overlapping portion in which signal lines 221 to 223 and the ground conductor 231 or 241 overlap each other in the laminating direction. More specifically, the recesses 210 are located at a position in a non-overlapping portion, in which the signal lines 221 to 223 and the ground conductor 231 or 241 do not overlap each other in the laminating direction, near the above-mentioned overlapping portion. Further, the recesses 210 are located so as to avoid the signal lines 221 to 223 formed in a resin substrate 202 as a conductor pattern.

Figure 11:
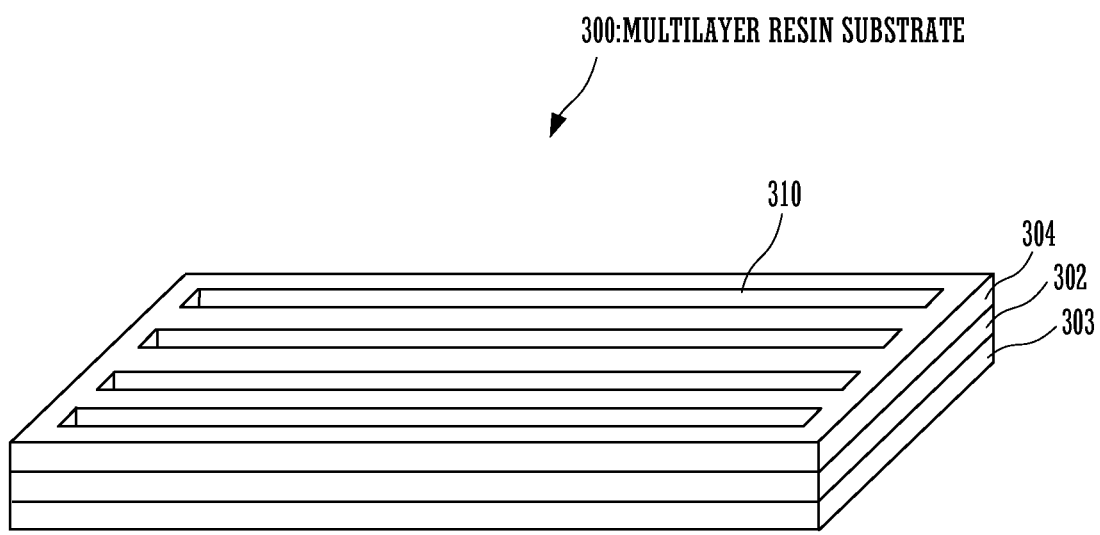
FIG. 11 schematically illustrates a multilayer resin substrate according to another preferred embodiment of the present invention.

Further, a multilayer resin substrate 300 illustrated in FIG. 11 may be provided with recesses 310 that extend continuously in the direction in which signal lines (not illustrated) extend. In the multilayer resin substrate 300, a resin substrate 302 is provided with signal lines similar to the signal lines 21 to 23 illustrated in FIG. 3. Further, as in the multilayer resin substrate 1 illustrated in FIG. 1, the recesses 310 in the multilayer resin substrate 300 according to this preferred embodiment are also located so as to avoid an overlapping portion in which the signal lines formed in the resin substrate 302 and the ground conductor overlap each other in the laminating direction. This makes it possible to significantly reduce or prevent degradation of characteristics due to factors such as variation of impedance and radiation noise. Further, isolation between the signal lines is also improved because of the air space (low dielectric constant layer) created by the recesses 310.

Figure 12:
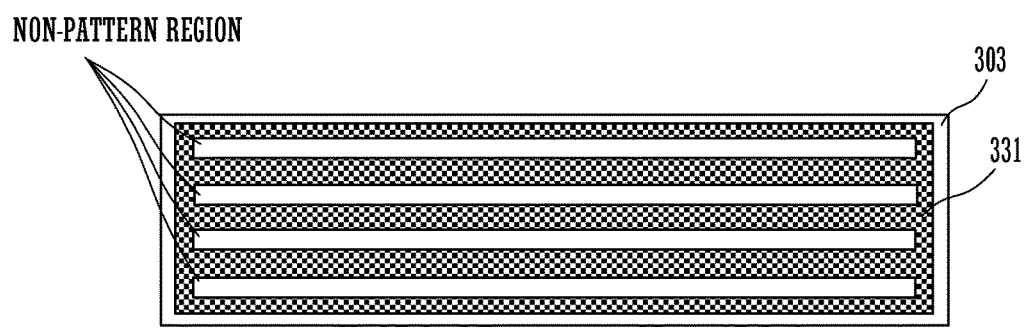
FIG. 12 is a plan view of a resin substrate in which a ground is formed as a conductor pattern, in a multilayer resin substrate according to another preferred embodiment of the present invention.

In this case, a ground conductor 331 provided in a resin substrate 303 may have the pattern illustrated in FIG. 12, and the resin sheet in non-pattern regions of the resin substrate 303 may be cut away to form cavities. Cavities similar to those in the resin substrate 303 are also preferably provided in a resin substrate 304.

In this case as well, as described above, the resin substrate 304 may or may not be provided with a ground conductor.

In this preferred embodiment as well, the recesses 310 are located so as to avoid the signal lines formed in the resin substrate 302 as a conductor pattern. However, the recesses 310 may be located at a position corresponding to the signal lines, as long as the recesses 310 are located in a non-overlapping portion in which the signal lines and the ground conductor do not overlap each other in the laminating direction.

Further, in the multilayer resin substrate according to each of the above preferred embodiments, each end of a signal line may be provided with a connector electrically connected to the signal line. Further, in an alternative configuration, a mounting portion on which to mount an IC may be formed integrally at one end side of a signal line, and a connector may be attached at the other end side of the signal line. The IC mounted to the mounting portion is electrically connected to the signal line.

In the multilayer resin substrate according to each of the above preferred embodiments, another circuit element (such as a capacitance pattern) may be formed in a resin substrate as a conductor pattern. Further, the multilayer resin substrate according to each of the above preferred embodiments may define a portion of a flexible circuit board in which another circuit element, a mounted component, or the like is present.

Further, in each of the above preferred embodiments, holes are preferably formed in at least predetermined one of the resin substrates to be laminated, in accordance with the position where recesses are to be formed. However, the holes in each of the above preferred embodiments may be formed as recesses that do not penetrate the resin substrate.

Further, according to various preferred embodiments of the present invention, the thin portion may be formed by joining the resin substrates together and then forming recesses at a position in the non-overlapping portion near the overlapping portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer resin substrate comprising:
a plurality of resin substrates that are laminated together;
an overlapping portion in which a signal line that is provided as a conductor pattern and another conductor pattern overlap each other in a laminating direction of the plurality of resin substrates;
a non-overlapping portion in which the signal line and the another conductor pattern do not overlap each other in the laminating direction of the plurality of resin substrates; and
a thin portion that is provided in the non-overlapping portion near the overlapping portion, the thin portion being a portion of the multilayer resin substrate which has a thickness smaller than a thickness of the plurality of resin substrates in the overlapping portion in the laminating direction of the plurality of resin substrates; wherein
the thin portion, in plan view in the laminating direction of the plurality of resin substrates, does not overlap the overlapping portion, and is defined by a plurality of recesses disposed along a direction in which the signal line extends or is defined by a plurality of recesses that extend continuously in the direction in which the signal line extends;
the thin portion is provided in only the plurality of resin substrates; and
the plurality of recesses are provided in a top resin substrate and a bottom resin substrate of the plurality of resin substrates.

2. The multilayer resin substrate according to claim 1, wherein the another conductor pattern is a ground pattern, another signal line, or a capacitance pattern.

3. The multilayer resin substrate according to claim 1, wherein in the plan view, the thin portion is located between a plurality of signal lines.

4. The multilayer resin substrate according to claim 1, wherein each of the plurality of resin substrates includes a resin sheet that has high flexibility.

5. The multilayer resin substrate according to claim 1, wherein each of the plurality of resin substrates includes a resin sheet that has thermal plasticity.

6. The multilayer resin substrate according to claim 1, wherein the plurality of resin substrates include three resin substrates.

7. The multilayer resin substrate according to claim 1, wherein the plurality of recesses are provided in two of the plurality of resin substrates so as to oppose each other with another one of the plurality of resin substrates located therebetween.

8. The multilayer resin substrate according to claim 7, wherein the plurality of recesses do not overlap the signal line.

* * * * *